(12) United States Patent
Yeh et al.

(10) Patent No.: US 8,754,439 B2
(45) Date of Patent: *Jun. 17, 2014

(54) LIGHT-EMITTING ELEMENT AND THE MANUFACTURING METHOD THEREOF

(71) Applicant: Epistar Corporation, Hsinchu (TW)

(72) Inventors: Jui Hung Yeh, Hsinchu (TW); Chun Kai Wang, Hsinchu (TW); Wei Yu Yen, Hsinchu (TW); Yu Yao Lin, Hsinchu (TW); Chien Fu Shen, Hsinchu (TW); De Shan Kuo, Hsinchu (TW); Ting Chia Ko, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/731,783

(22) Filed: Dec. 31, 2012

(65) Prior Publication Data

US 2013/0119429 A1     May 16, 2013

Related U.S. Application Data

(63) Continuation of application No. 13/106,310, filed on May 12, 2011, now Pat. No. 8,344,392.

(51) Int. Cl.
*H01L 33/00* (2010.01)

(52) U.S. Cl.
USPC .............. 257/99; 257/98; 257/E33.065

(58) Field of Classification Search
USPC ................. 257/79, 98, 99, E33.065
See application file for complete search history.

(56) References Cited

U.S. PATENT DOCUMENTS

| | | | |
|---|---|---|---|
| 5,468,656 A | 11/1995 | Shieh et al. | |
| 7,352,009 B2 | 4/2008 | Fudeta | |
| 7,723,732 B2 | 5/2010 | Tazima et al. | |
| 7,763,898 B2 | 7/2010 | Tanaka et al. | |
| 7,939,839 B2 | 5/2011 | Hasnain | |
| 8,129,207 B2 | 3/2012 | Lee | |
| 2009/0267105 A1 | 10/2009 | Yu et al. | |
| 2010/0171135 A1* | 7/2010 | Engl et al. | 257/98 |
| 2010/0244083 A1 | 9/2010 | Kim | |
| 2011/0012146 A1 | 1/2011 | Hitsuda et al. | |
| 2012/0161188 A1* | 6/2012 | Hwang | 257/98 |

FOREIGN PATENT DOCUMENTS

| | | |
|---|---|---|
| JP | 07-221347 | 8/1995 |
| JP | 09-148545 | 6/1997 |
| JP | 2005-019653 | 1/2005 |

* cited by examiner

*Primary Examiner* — Tuan N. Quach
(74) *Attorney, Agent, or Firm* — Muncy, Geissler, Olds & Lowe, P.C.

(57) ABSTRACT

A light-emitting element includes a light-emitting stack includes: a first semiconductor layer; an active layer formed on the first semiconductor layer; and a second semiconductor layer formed on the active layer; a recess structure formed through the second semiconductor layer, the active layer, and extended in the first semiconductor layer, wherein the first semiconductor layer includes a contact region defined by the recess structure; a first electrode structure including a first contact portion on the contact region of the first semiconductor layer, and a second contact portion laterally extended from the first contact portion into the first semiconductor layer; and a dielectric layer formed on side surfaces of the second semiconductor layer and the active layer to insulate the second semiconductor layer and the active layer from the first contact portion.

14 Claims, 9 Drawing Sheets

LIGHT-EMITTING ELEMENT AND THE MANUFACTURING METHOD THEREOF

CROSS REFERENCE TO RELATED APPLICATION

This application is a Continuation of application Ser. No. 13/106,310, filed on May 12, 2011, now U.S. Pat. No. 8,344,392, for which priority is claimed under 35 U.S.C. §120, the entire contents of all of which are hereby incorporated by reference.

TECHNICAL FIELD

The application relates to a light-emitting element and the manufacturing method thereof.

DESCRIPTION OF BACKGROUND ART

The features of the light emitting diode (LED) mainly include the small size, high efficiency, long life, quick reaction, high reliability, and fine color. So far, the LED has been applied to electronic devices, vehicles, signboards, traffic signs, and many other applications. Along with the launch of the full-color LED, LED has gradually replaced traditional lighting apparatus such as fluorescent lights and incandescent lamps.

Referring to FIG. 1, a light-emitting device 1 includes a p-type electrode and an n-type electrode. The p-type electrode includes p-type bonding pads 14, two first armed electrodes 14a extending from the p-type bonding pad 14, and second armed electrodes 14b interposed between two first armed electrodes 14a. The current is injected from the p-type bonding pad 14 and spread by the armed electrodes. The n-type electrode includes n-type bonding pads 15, third armed electrodes 15a, and fourth armed electrodes 15b. The current is injected from the p-type electrode, moves to the light-emitting region of the light-emitting device 1, and then flows to and out of the n-type electrode. The p-type armed electrodes 14a, 14b and the n-type armed electrodes 15a, 15b are interdigitated between each other.

SUMMARY OF THE DISCLOSURE

A light-emitting element includes a light-emitting stack including: a first semiconductor layer; an active layer formed on the first semiconductor layer; and a second semiconductor layer formed on the active layer; a recess structure formed through the second semiconductor layer, the active layer, and extended in the first semiconductor layer, wherein the first semiconductor layer includes a contact region defined by the recess structure; a first electrode structure including a first contact portion on the contact region of the first semiconductor layer, and a second contact portion laterally extended from the first contact portion into the first semiconductor layer; and a dielectric layer formed on side surfaces of the second semiconductor layer and the active layer to insulate the second semiconductor layer and the active layer from the first contact portion.

A manufacturing method of a light-emitting element including steps of: providing a light-emitting element including a substrate; and a light-emitting stack including a first semiconductor layer, an active layer formed on the first semiconductor layer, and a second semiconductor layer formed on the active layer; forming at least a recess structure through the second semiconductor layer and the active layer, and extended into first semiconductor layer; forming a dielectric layer on the second semiconductor layer and the active layer in the recess structure; forming an embedded hole laterally extended from the recess structure into the first semiconductor layer; and forming a first electrode structure on the first semiconductor layer via the recess structure and the embedded hole.

DETAILED DESCRIPTION OF PREFERRED EMBODIMENTS

Figure 1:
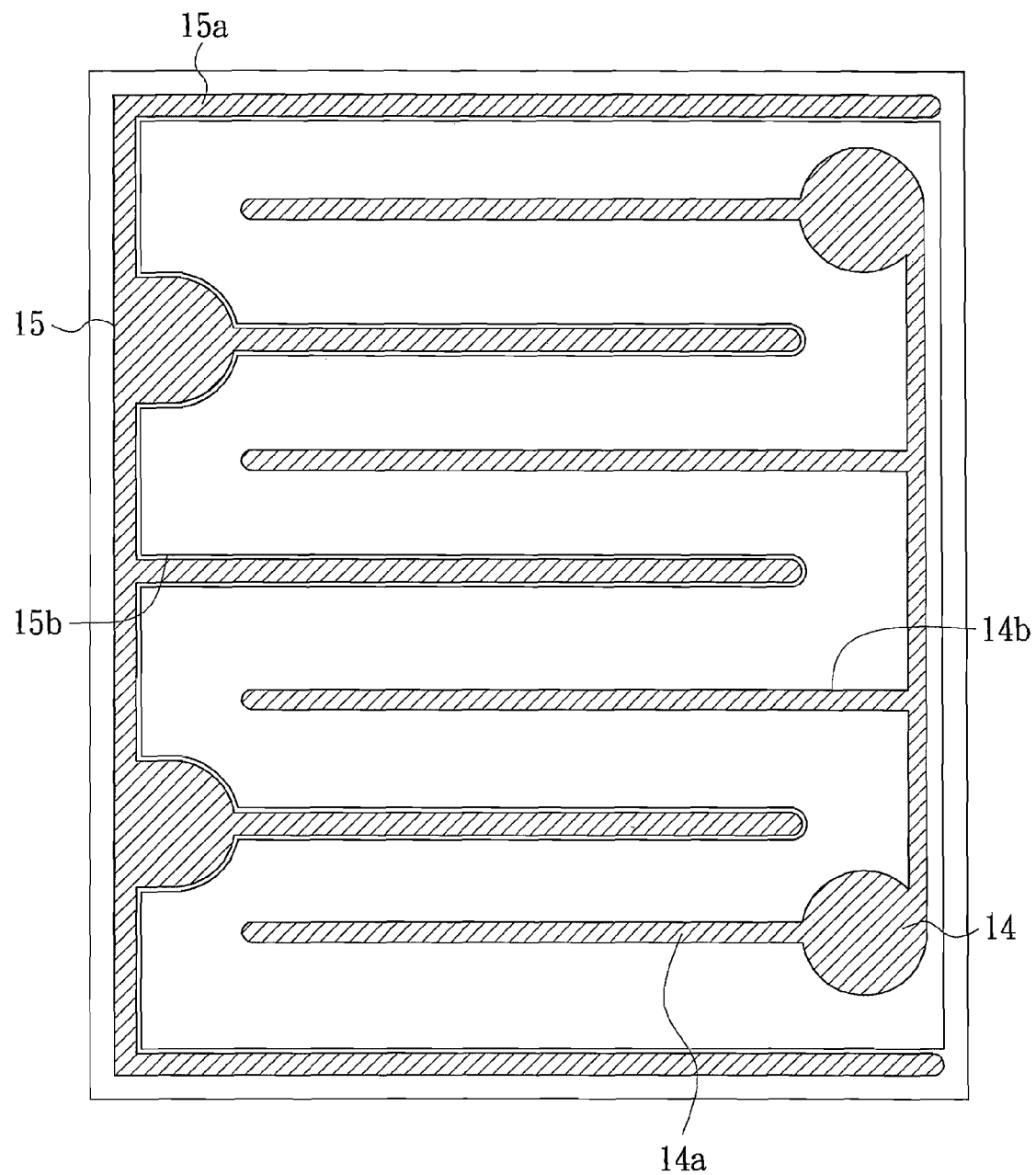
FIG. 1 is a top view of a conventional light-emitting device.
Figure 2A:
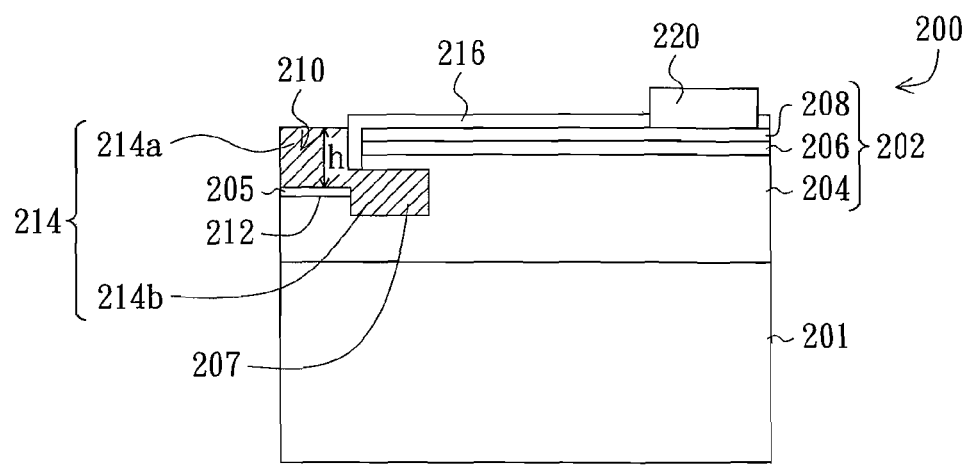
FIG. 2A is a cross-sectional view of a light-emitting element of a first embodiment of the present application.

As shown in FIG. 2A, a light-emitting element 200 of a first embodiment of the present application includes: a light-emitting stack 202 including a first semiconductor layer 204, an active layer 206 formed on the first semiconductor layer 204, and a second semiconductor layer 208 formed on the active layer 206; a recess structure 210 formed through the second semiconductor layer 208, the active layer 206, and extended in the first semiconductor layer 204, wherein the first semiconductor layer 204 includes a contact region 212 defined by the recess structure 210; a first electrode structure 214 including a first contact portion 214a on the contact region 212 of the first semiconductor layer 204, and an second contact portion 214b laterally extended from the first contact portion 214a into the first semiconductor layer 204, wherein a partial portion of the second contact portion 214b is lower than the contact region 212; and a dielectric layer 216 formed on the upper surface of second semiconductor layer 208 and side surfaces of the second semiconductor layer 208 and the active layer 206 so the second semiconductor layer 208 and the active layer 206 is insulated from the first contact portion 214a. The thickness h of the first contact portion 214a, which is defined by the distance from the contact region 212 to the top of the first contact portion 214a can be thicker than 3000 Å, or the top of the first contact portion 214a can reach a level between the active layer 206 and the upper surface of the second semiconductor layer 208. An etching stop layer 205 can be formed between the first electrode structure 214 and the contact region 212 of the first semiconductor layer 204. The etching stop layer 205 can be a film made of one material selected from the group consisting of Ti, Cr, Cu, Mo, Ni, Au, Ag, Pt, W, Al, Fe, Co, Pd, Sn, and Zn, or a metal alloy thereof. The light-emitting element 200 further includes a substrate 201 for carrying the light-emitting stack 202, wherein the material of substrate 201 can be electrically insulative such as sapphire, diamond, glass, quartz, acryl, ZnO, or AlN. The substrate 201 can also be a conductive material such as GaN, GaAs, or Si with an insulative bonding layer formed between the substrate 201 and the light-emitting stack 202. Further referring to FIG. 2B, the first electrode 214 includes a bonding electrode 217 and at least an extension electrode 218 extended from the bonding electrode 217, and the first contact portion 214a in FIG. 2A can be the bonding electrode 217 and/or the extension electrode 218. The second contact portion 214b can be extended from the extension electrode 218, the bonding electrode 217, or both of the extension electrode 218 and the bonding electrode 217. The conventional light-emitting element usually has upper and lower electrode structures on the same side, and an extension electrode of the lower electrode structure is located in a recess structure. The width of the extension electrode must be smaller than that of the recess structure for insulation purpose, but the electrical contact between the extension electrode and the semiconductor layer is therefore poor. In the present embodiment, the extension electrode 218 can have good electrical contact with the first semiconductor layer 204 by extending the second contact portion 214b into the first semiconductor 204. Moreover, the second contact portion 214b is under the active layer 206 and does not block the light emitted from the active layer 206. Furthermore, the width of the extension electrode 218 can approach to the width of the recess structure 210 to be wider than that of the conventional light-emitting element, and the electrical resistance of the extension electrode 218 can be lowered. In addition, the light-emitting element 200 can further include a second electrode structure 220 including a bonding electrode 222 and an extension electrode 224 extended from the bonding electrode 222.

The material of the light-emitting stack 202 can be III-V group semiconductor materials containing Al, Ga, In, N, P or As elements, such as GaN series, AlGaInP series or GaAs series. The first semiconductor layer 204 can be n type, and the second semiconductor layer 208 can be p type, or the polarity of them can be exchanged. The manufacturing method of the light-emitting element 200 can include forming the recess structure 210 through the second semiconductor layer 208, the active layer 206, and extended into the first semiconductor layer 204, and during the process of forming the recess structure 210, the dielectric layer 216 covers the second semiconductor layer 208 and the active layer 206 in the recess structure 210; forming an embedded hole 207 laterally extended from the recess structure 210 into the first semiconductor layer 204; and forming the first electrode structure 214 on the first semiconductor layer 204 via the recess structure 210 and the embedded hole 207. The details of the process for producing the first electrode structure 214 are described as follows.

Figure 2B:
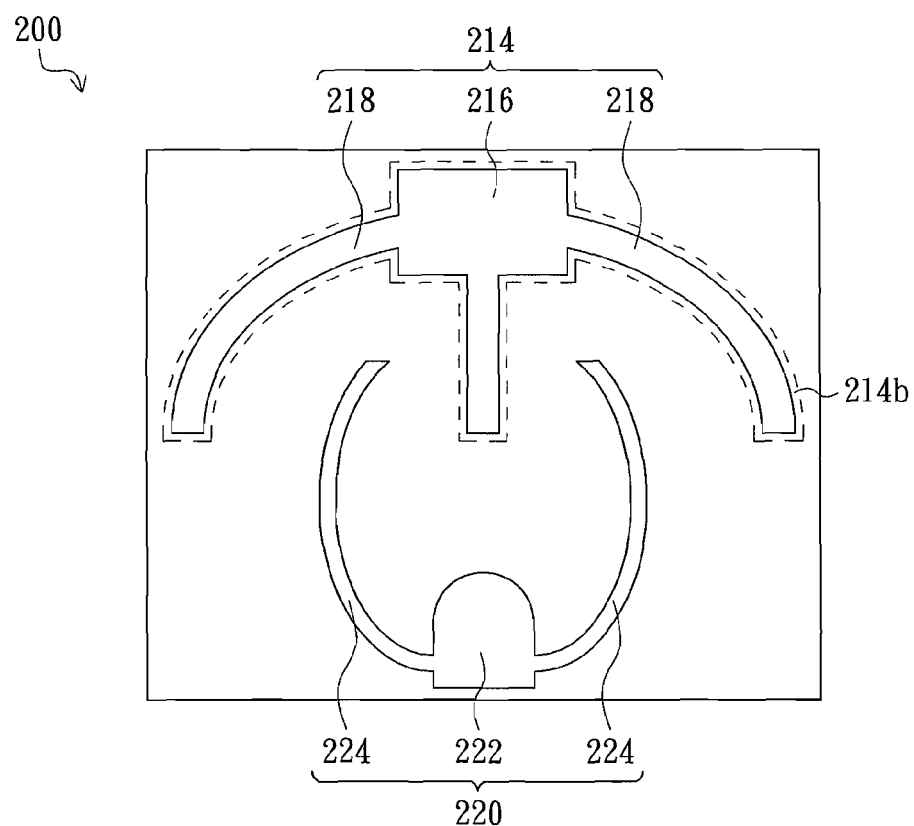
FIG. 2B is a top view of a light-emitting element of a first embodiment of the present application.
Figure 3A:
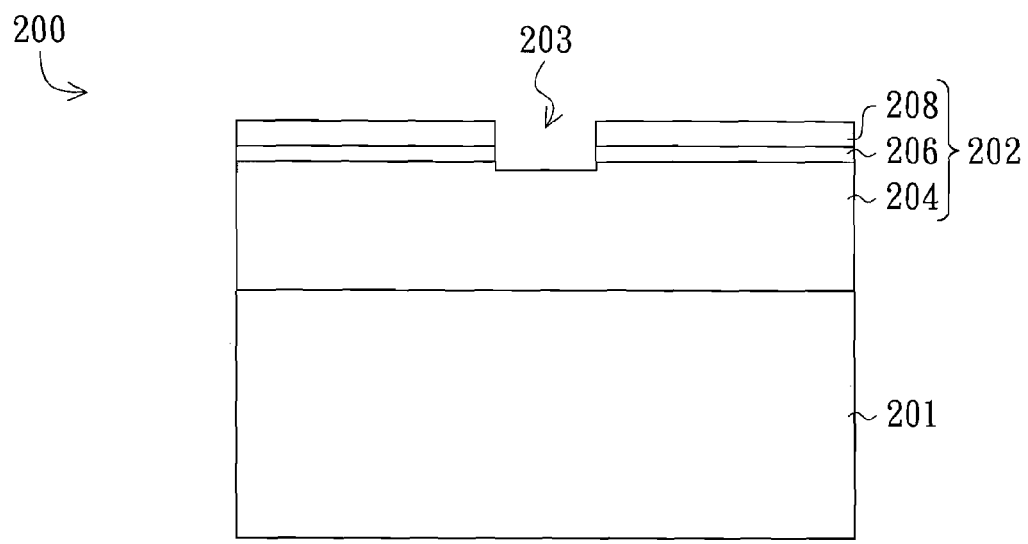
FIG. 3A to FIG. 3F show a manufacturing method of a light-emitting element of a first embodiment of the present application.
Figure 3B:
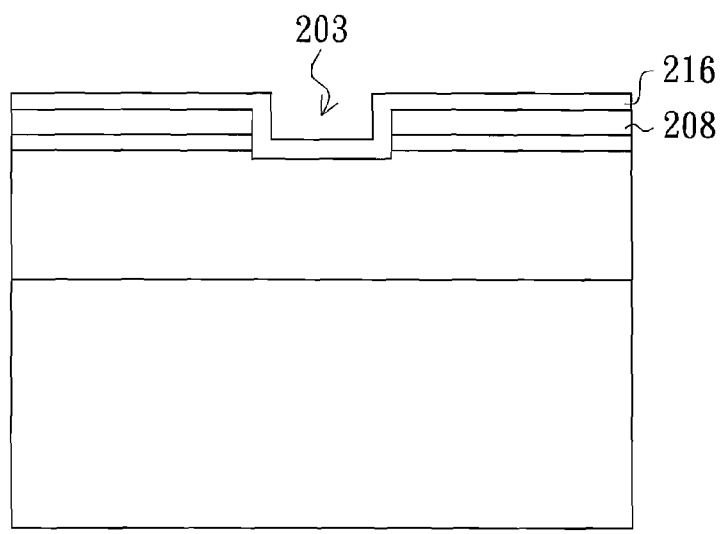
Figure 3C:
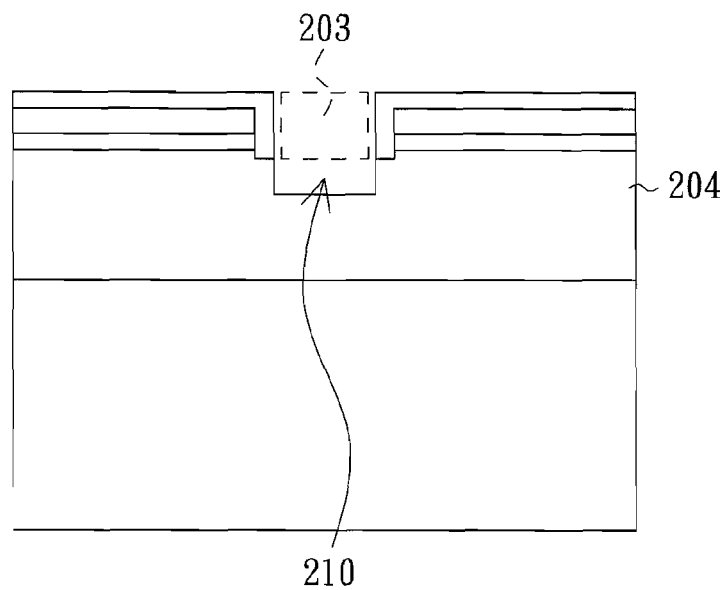
Figure 3D:
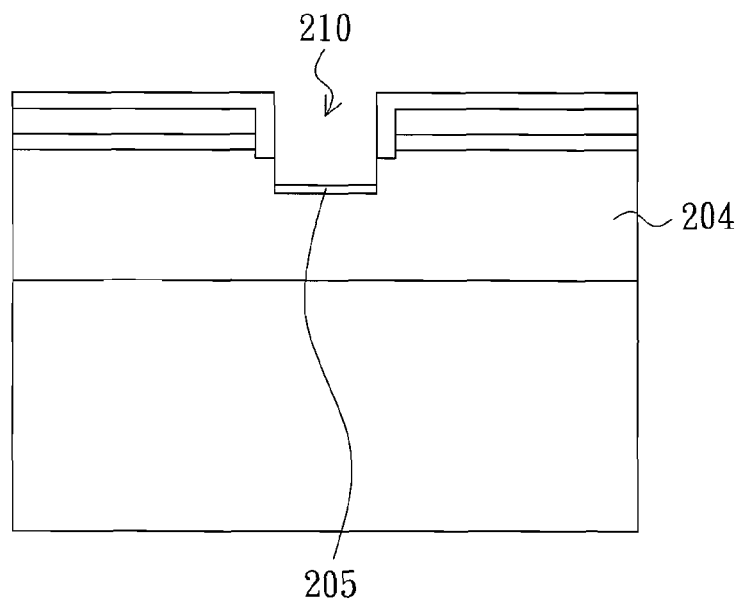
Figure 3E:
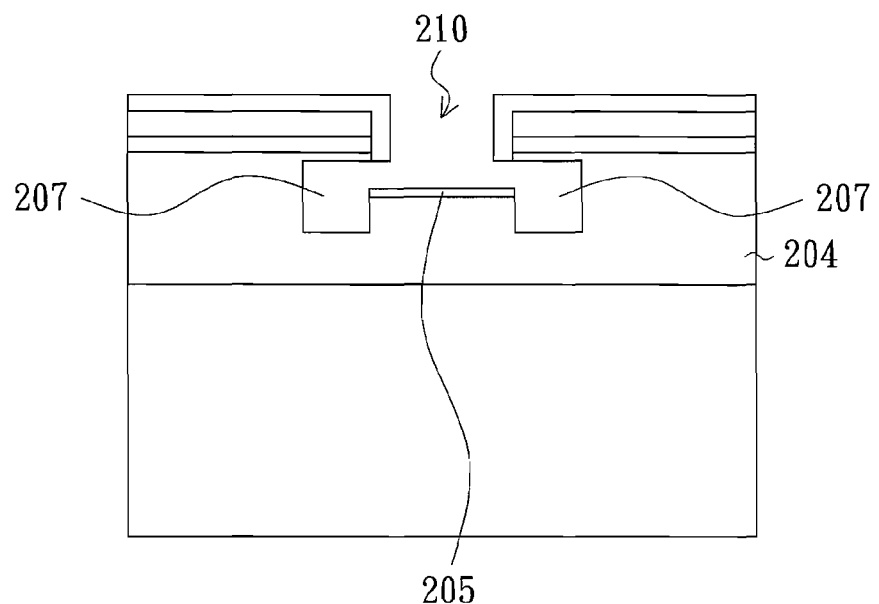
Figure 3F:
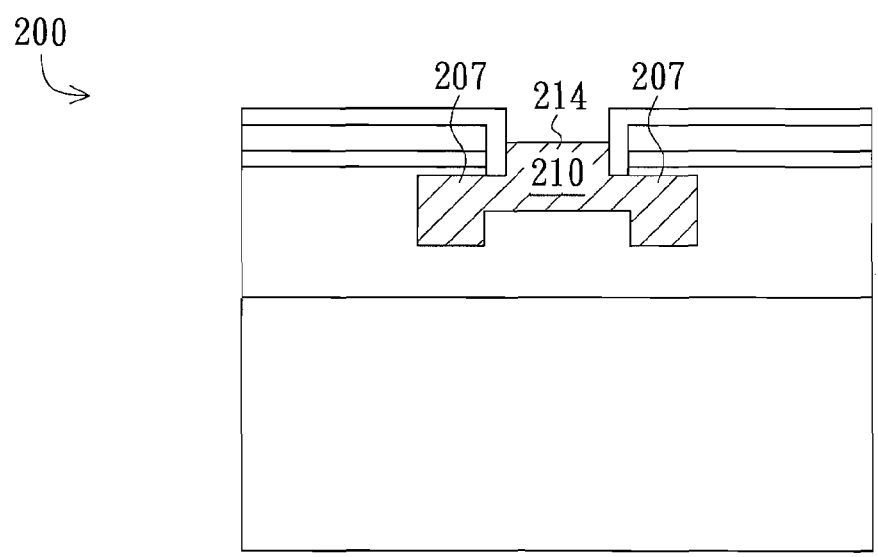

Referring to FIG. 3A to FIG. 3D, a manufacturing method of a light-emitting element of the first embodiment of the present application is disclosed. As shown in FIG. 3A, a light-emitting element 200 includes a substrate 201; and a light-emitting stack 202 formed on the substrate 201 and including a first semiconductor layer 204, an active layer 206 formed on the first semiconductor layer 204, and a second semiconductor layer 208 formed on the active layer 206. An initial recess structure 203 is formed through the second semiconductor layer 208 and the active layer 206 to expose the first semiconductor layer 204 by etching process such as wet etching. As shown in FIG. 3B, a dielectric layer 216 covers the second semiconductor layer 208 and the initial recess structure 203, wherein the dielectric layer 216 can be $SiN_x$ or $SiO_2$ formed by deposition, or silicone resin, BCB, epoxy, polyimide or PFCB formed by coating. As shown in FIG. 3C, the dielectric layer 216 on the bottom surface of the initial recess structure 203 is removed by a wet etching process, and then a recess structure 210 is formed by extending the initial recess structure 203 into the first semiconductor layer 204 by another wet etching process. As shown in FIG. 3D, an etching stop layer 205 can be optionally formed on the bottom surface of the recess structure 210. As shown in FIG. 3E, an embedded hole 207 is laterally extended from the recess structure 210 by etching process such as wet etching, and the bottom surface of the recess structure 210 is not etched because of the etching stop layer 205 thereon. The embedded hole 207 can be also vertically extended in the first semiconductor layer 204 by controlling the etching period. As shown in FIG. 3F, forming a first electrode structure 214 including metal or metal alloy in the embedded hole 207 and, the recess structure 210 by plating process such as chemical plating (electroless plating) or electro plating. Referring to FIG. 2B, the second electrode structure 220 can be formed at the same time by covering a mask (not shown) on the light-emitting element 200 to expose a predetermined plating region of the first semiconductor layer 204 and the second semiconductor layer 208, and then performing the plating, and the mask can be removed after forming the first electrode structure 214 and the second electrode structure 220.

Figure 4:
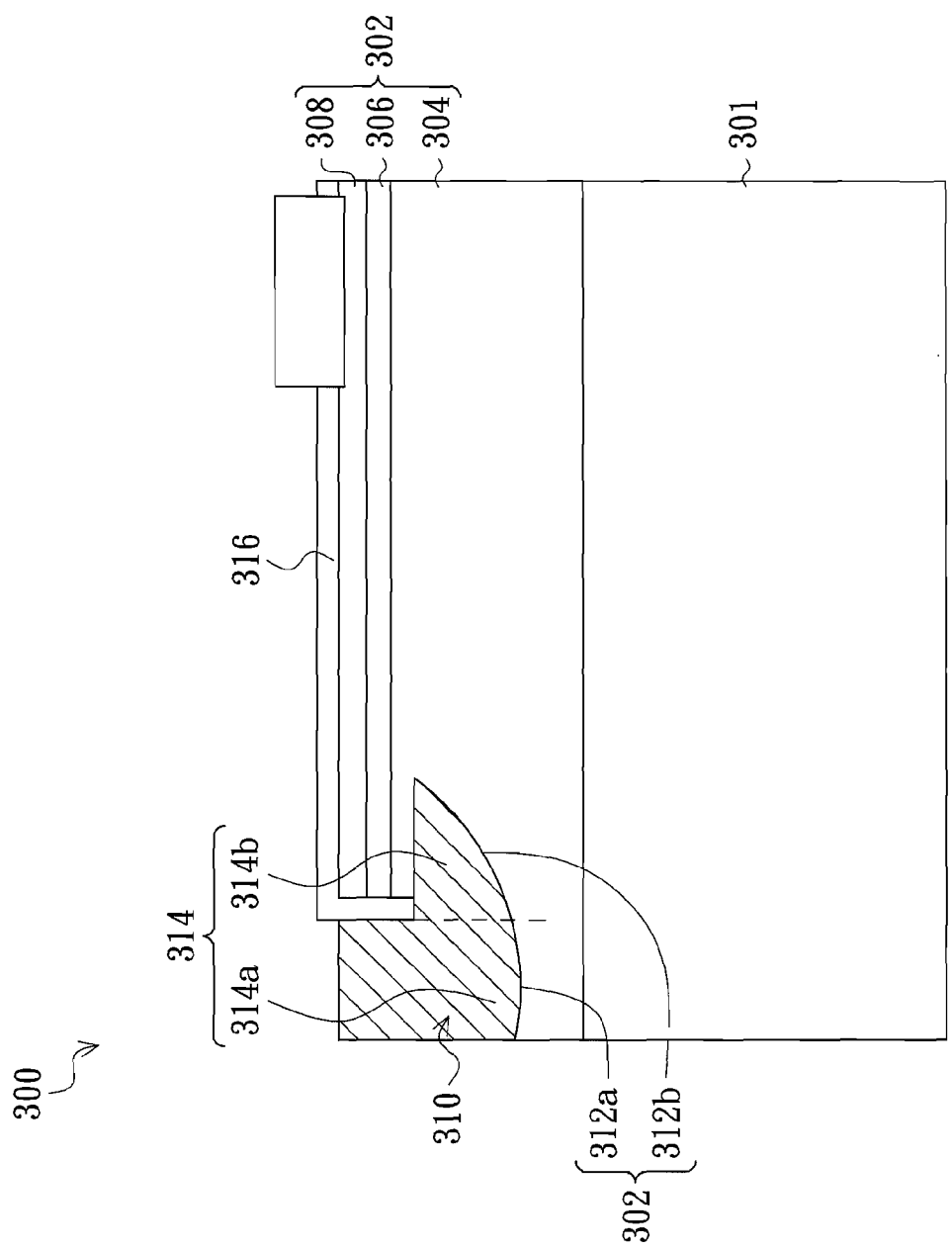
FIG. 4 is a cross-sectional of a light-emitting element of a second embodiment of the present application.

As shown in FIG. 4, a light-emitting element 300 of a second embodiment of the present application includes a light-emitting stack 302 including a first semiconductor layer 304, an active layer 306 formed on the first semiconductor layer 304, and a second semiconductor layer 308 formed on the active layer 306; a recess structure 310 formed through the second semiconductor layer 308, the active layer 306, and extended into the first semiconductor layer 304, wherein the first semiconductor layer 304 includes a contact region 312 defined by the recess structure 310, wherein the contact region 312 includes a first section 312a, and a second section 312b laterally extended from the first section 312a into the first semiconductor layer 304; a first electrode structure 314 including a first contact portion 314a on the first section 312a of the first semiconductor layer 304, and a second contact portion 314b laterally extended from the first contact portion 314a into the first semiconductor layer 304 along the second region 312b of the contact region 312; and a dielectric layer 316 formed on the upper surface of the second semiconductor layer 308 and side surfaces of on the second semiconductor layer 308 and the active layer 306 so the second semiconductor layer 308 and the active layer 306 is insulated from the first contact portion 314a of the first electrode structure 314. The difference between the first embodiment and the present embodiment is that the first contact portion 314a is directly in contact with the contact region 312 of the first semiconductor layer 304, and the recess structure 310 is deeper than that of the first embodiment. The contact region 312 defined by the recess structure 310 is an arc surface.

Figure 5A:
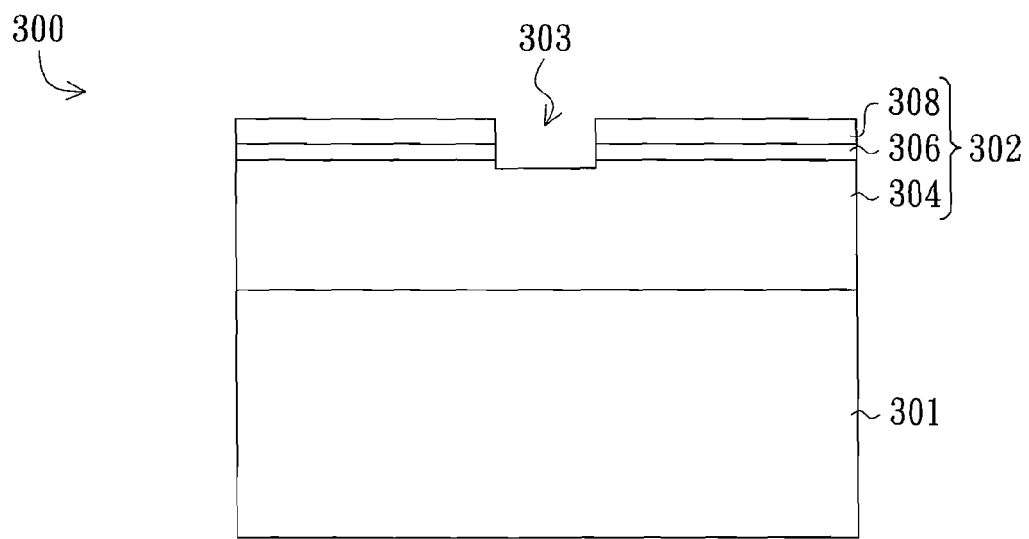
FIG. 5A to FIG. 5E show a manufacturing method of a light-emitting element of a second embodiment of the present application.
Figure 5B:
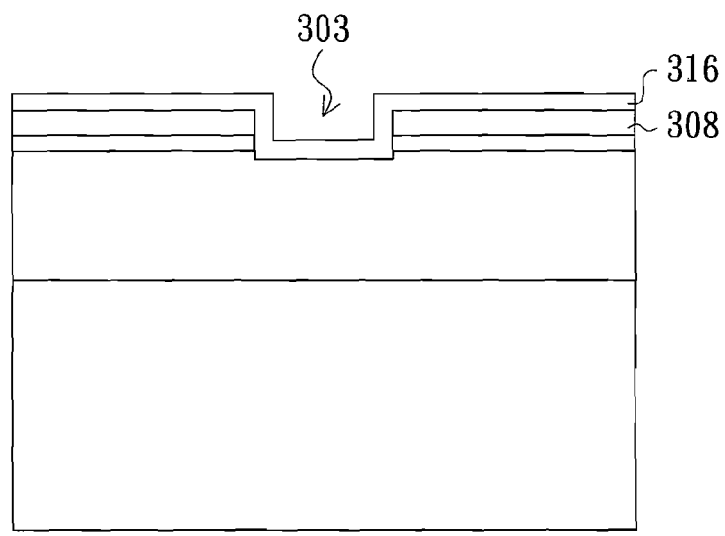
Figure 5C:
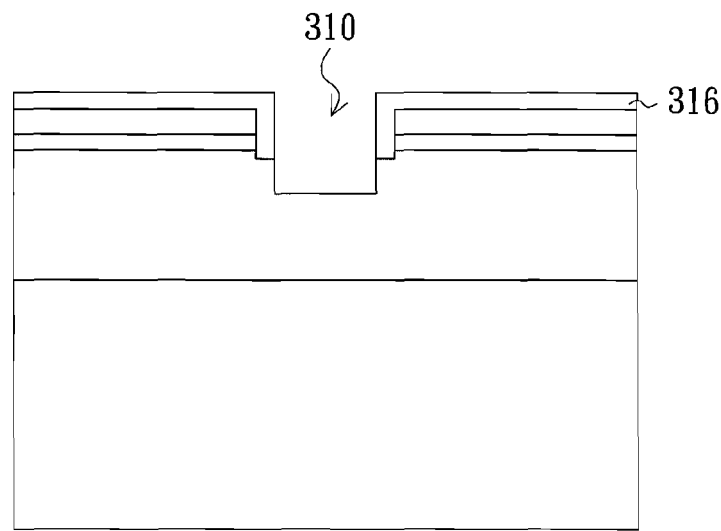
Figure 5D:
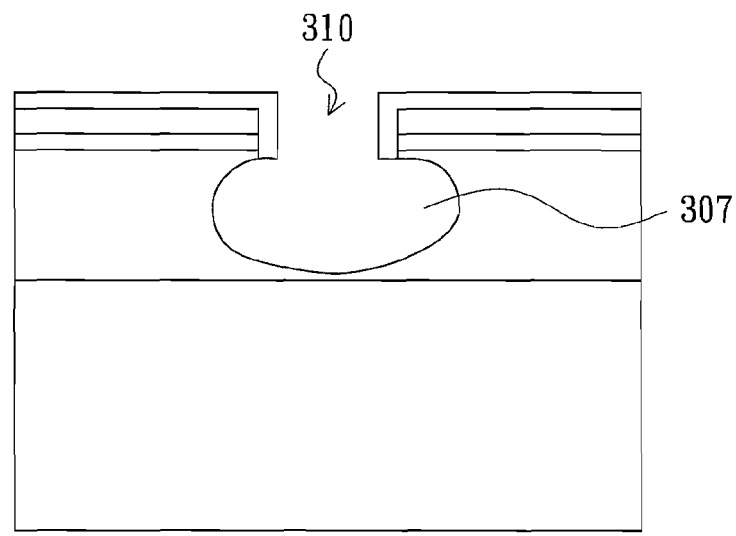
Figure 5E:
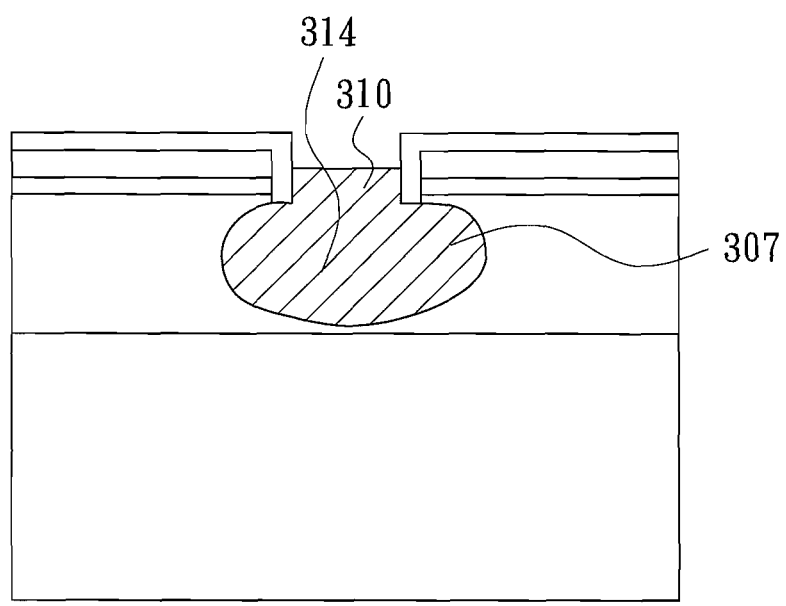

Referring to FIG. 5A to FIG. 5E, a manufacturing method of a light-emitting element of the second embodiment of the present application is disclosed. As shown in FIG. 5A, a light-emitting element 300 includes a substrate 301; and a light-emitting stack 302 including a first semiconductor layer 304, an active layer 306 formed on the first semiconductor layer 304, and a second semiconductor layer 308 formed on the active layer 306. An initial recess structure 303 is formed through the second semiconductor layer 308 and the active layer 306 to expose the first semiconductor layer 304 by etching process such as wet etching. As shown in FIG. 5B, a dielectric layer 316 conformably covers the surface of the second semiconductor layer 308 and the initial recess structure 303, wherein the dielectric layer 316 can be such as $SiN_x$ or $SiO_2$ formed by deposition, or silicone resin, BCB, epoxy, polyimide or PFCB formed by coating. As shown in FIG. 5C, the dielectric layer 316 on the bottom surface of the initial recess structure 303 is removed by wet etching process, and then a recess structure 310 is formed by extending the initial recess structure 303 into the first semiconductor layer 304 by another wet etching process. As shown in FIG. 5D, a chamber 307 is laterally and vertically extended from the recess structure 310 by etching process such as wet etching. As shown in FIG. 5E, forming a first electrode structure 314 including metal or metal alloy in the chamber 307 and the recess structure 310 by plating process such as chemical plating (electroless plating) or electro plating.

Although the present application has been explained above, it is not the limitation of the range, the sequence in practice, the material in practice, or the method in practice. Any modification or decoration for present application is not detached from the spirit and the range of such.

What is claimed is:

1. A light-emitting element comprising:
   a light-emitting stack comprising an upper surface and a lower surface opposite to the upper surface;
   a recess structure penetrating the upper surface, and comprising a first bottom surface in the light-emitting stack and a first side surface connected between the upper surface and the first bottom surface;
   a first electrode structure comprising a second bottom surface electrically connected to the first bottom surface, and a second side surface facing the first side surface; and
   a dielectric layer formed between the first side surface and the second side surface, wherein the first electrode structure is entirely between the upper surface and the lower surface of the light-emitting stack.

2. The light-emitting element according to claim 1, wherein the light-emitting stack further comprises:
   a first semiconductor layer facing the first bottom surface and having a thickness;
   an active layer formed on the first semiconductor layer; and
   a second semiconductor layer formed on the active layer.

3. The light-emitting element according to claim 2, wherein the recess structure has a depth less than the thickness of the first, semiconductor layer.

4. The light-emitting element according to claim 3, wherein the first electrode structure comprises a contact portion laterally extended into the first semiconductor layer.

5. The light-emitting element according to claim 4, wherein the first electrode structure comprises a pad electrode and an extension electrode extended from the pad electrode, and the contact portion is extended from the extension electrode.

6. The light-emitting element according to claim 4, wherein the first electrode structure comprises a pad electrode and an extension electrode extended from the pad electrode, and the contact portion is extended from the pad electrode.

7. The light-emitting element according to claim 4, wherein the first electrode structure comprises a pad electrode and an extension electrode extended from the pad electrode, and the contact portion is extended from the pad electrode and the extension electrode.

8. The light-emitting element according to claim 4, wherein the contact portion is under the active layer.

9. The light-emitting element according to claim 2, wherein the first side surface is connected to the second semiconductor layer, the active layer, and a partial thickness of the first semiconductor.

10. The light-emitting element according to claim 2, further comprising a second electrode structure formed on the second semiconductor layer.

11. The light-emitting element according to claim 2, wherein the second bottom surface of the first electrode structure is directly connected to the first semiconductor layer.

12. The light-emitting element according to claim 11, wherein the first bottom surface comprises an arc surface.

13. The light-emitting element according to claim 1, wherein the first electrode structure comprises a top end opposite to the second bottom surface, and the top end is higher than the active layer and lower than the upper surface.

14. The light-emitting element according to claim 1, further comprising a metal layer formed between the second bottom surface of the first electrode structure and the first bottom surface of the recess structure.

* * * * *